(12) United States Patent
Zhang et al.

(10) Patent No.: US 9,377,792 B2
(45) Date of Patent: Jun. 28, 2016

(54) CHIP LEVEL INTEGRATION OF A BOOSTED CLASS-D AMPLIFIER AND INTEGRATED LED FLASH DRIVER

(75) Inventors: Lingli Zhang, Austin, TX (US); Michael Pate, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 956 days.

(21) Appl. No.: 13/548,963

(22) Filed: Jul. 13, 2012

(65) Prior Publication Data

US 2013/0181523 A1  Jul. 18, 2013

Related U.S. Application Data

(60) Provisional application No. 61/508,435, filed on Jul. 15, 2011.

(51) Int. Cl.
| | |
|---|---|
| G05F 1/10 | (2006.01) |
| H03F 3/217 | (2006.01) |
| H05B 33/08 | (2006.01) |
| H02M 3/156 | (2006.01) |

(52) U.S. Cl.
CPC ........... *G05F 1/10* (2013.01); *H03F 3/217* (2013.01); *H05B 33/0842* (2013.01); *H02M 3/156* (2013.01); *Y10T 307/438* (2015.04)

(58) Field of Classification Search
None
See application file for complete search history.

(56) References Cited

U.S. PATENT DOCUMENTS

| | | | |
|---|---|---|---|
| 7,802,113 B2 * | 9/2010 | Westwick et al. | 713/300 |
| 2010/0045245 A1 * | 2/2010 | Hawley | 323/222 |
| 2010/0066311 A1 * | 3/2010 | Bao et al. | 320/162 |

OTHER PUBLICATIONS

"Power Light Source LUXEON® Flash," Technical Datasheet DS49, Oct. 2006, Philips Lumileds Lighting Company, Silicon Valley, CA.
"High Efficiency Boost Converter for Backlight/Flash LED Driver," Technical Datasheet SC4505, 2007, Semtech Corp., Camarillo, CA.
"1.5A/4.1A Multiple LED Camera Flash Driver With I2C™ Compatible Interface," Technical Datasheet SLVS957A, Jun. 2009, rev. Sep. 2010, Texas Instruments, Inc., Dallas, TX.
"1.5A Step-Up Current Regulator for Flash LEDs," Product Datasheet AAT1271, Apr. 2009, Advanced Analogic Technologies, Inc., Santa Clara, CA.

* cited by examiner

*Primary Examiner* — Jared Fureman
*Assistant Examiner* — Joel Barnett
(74) *Attorney, Agent, or Firm* — Steven Lin, Esq.

(57) ABSTRACT

A single integrated circuit includes a single boost converter, a first circuit, a second circuit, and a controller. The single boost converter supplies power to the first and second circuits. The controller receives an operational mode signal and in response to the operational mode signal, drives the single boost converter to respectively provide power to the first and second circuits. When the first and second circuits are simultaneously active, the controller manages an operation of the first circuit so that proper operation of the second circuit is maintained. The first circuit may be an LED flash driver, and the second circuit may be an audio amplifier, such as a Class-D audio amplifier. The controller manages an operation of the audio amplifier so that a sufficient amount of current is supplied to the LED flash driver for proper operation of the LED flash driver.

26 Claims, 8 Drawing Sheets

| IC 200 Mode of Operation | LED Flash Driver Mode | Power from Boost Converter | Power required for LED Flash Driver | Power required by Audio Amplifier |
|---|---|---|---|---|
| LED Flash Mode | Camera Mode | P_boost | P_Camera | P_boost - P_Camera |
| LED Flash Mode | Movie Mode | P_boost | P_Movie | P_boost - P_Movie |
| Audio Amplifier Mode | — | P_boost | 0 | P_boost |

Figure 8

CHIP LEVEL INTEGRATION OF A BOOSTED CLASS-D AMPLIFIER AND INTEGRATED LED FLASH DRIVER

The present invention claims priority to U.S. provisional patent application Ser. No. 61/508,435, filed 15 Jul. 2011 and is incorporated by reference in its entirety.

FIELD OF INVENTION

The present invention generally relates to an integrated circuit, and, more particularly, to using a single boost converter in a single integrated circuit that supplies power to two or more separate operational or functional circuits in the single integrated circuit.

BACKGROUND OF THE INVENTION

Many mobile phones on the market today provide phone functionality and also have a built in camera with flash capability in order to take higher quality photos. These phones require circuitry that enables audio functionality for the phone and the flash capability. Audio functionality for a mobile phone is not just limited to the phone functionality but can also include the audio functionality for playing music, games, and videos and running applications and programs.

The camera flashes on mobile phones use light emitting diode (LED) flash drivers to enable flash capability. The majority of these flashes for mobile phones are enabled through a boosted LED flash driver (e.g., having a boost converter). The boost converter is used for powering the LED driver and works to provide a constant current source. The output voltage of the boost converter changes with the forward voltage drop of the LED flash driver because the LED flash driver needs a constant current with a threshold forward voltage applied in order to enable it. The LED flash driver will require a certain power to operate as the battery voltage decreases over time to maintain flash capability, and therefore a boost converter is required. The typical forward voltage drop of the LED flash to enable the LED flash drivers is between 2.6 Volts and 3.8 Volts, and the boost voltage will vary according to the typical forward voltage drop. FIG. 1 shows a forward current versus forward voltage plot diagram for an exemplary LED flash driver in accordance with the prior art that is disclosed in Phillips Lumileds Lighting Company Technical Datasheet DS49 for LUXEON Flash dated October 2006. Generally, the flash driver uses a boost converter that works as a constant current source wherein the flash driver is enabled using hardware pins and configurable via an I²C interface. Such an exemplary LED flash driver is disclosed in Analogic Tech Product Datasheet AAT 1271 for 1.5 A Step-Up Current Regulator for Flash LED dated April 2009.

Also, mobile phones on the market today use a boosted audio amplifier for a more efficient system and for higher and louder audio quality. A boosted audio amplifier comprises a boost converter powering an audio amplifier. By boosting the audio amplifier, the sound output of the amplifier will be increased and louder. In addition, by boosting the voltage to a higher voltage level, the sound output will no longer be clipped by the battery voltage threshold because the audio amplifier is not limited to the voltage supplied by the battery.

Different types of audio amplifiers exist. Such types of amplifiers include but are not limited to Class D, H, A, B, and A-B amplifiers. A boosted class-D amplifier can deliver a higher output power independent of the battery voltage because the boost can guarantee constant deliverance of power into the audio amplifier. When a boost converter is used for powering a class-D amplifier, the boost converter works to provide a constant voltage source to the audio amplifier. In another case, a class-H scheme is implemented to maximize the boost converter efficiency by varying the boost output voltage at a certain signal level. At each respective signal level, the boost converter works to provide a corresponding constant voltage source. One disadvantage of the powering scheme for a boosted Class-D amplifier is that the overall system cost and size increase due to the requirements of additional components related to operating the boost converter with the audio amplifier.

Since both the LED flash driver and the audio amplifier require a similar or same type of boost converter, there is a desire and need for both the LED flash driver and audio amplifier to be supplied by a single boost converter.

FIG. 2 depicts an exemplary block diagram of an LED flash driver and audio amplifier power supply in accordance with the prior art in which a single boost converter is used to simultaneously drive both the LED flash driver and audio amplifier power supply. Such an exemplary circuit implementation is disclosed in Texas Instruments Datasheet for TPS61300, TPS61301, TPS61305 entitled "1.5 A/4.1 A Multiple LED Camera Flash Driver with I2CTM Compatible Interface" dated June 2009 and revised September 2010. Referring to FIG. 2, a constant DC voltage supply 102 is coupled to a capacitor 104 and an inductor 106. Moreover, the inductor 106 is coupled to an integrated circuit ("IC") 108 that comprises a single boosted LED driver and controller. The boosted LED flash driver IC 108 drives the LED flash light using another capacitor 110 and diodes 112,114. The LED flash driver IC 108 also drives an audio amplifier 124. The audio amplifier 124 comprises a Class-D amplifier 120, two audio inputs 116,118 and a speaker system 122 that outputs an audio signal. Control of LED flash driver IC 108 and audio amplifier 124 is provided at the board level. Such control at the board level can be provided through system software that uses a General Purpose Input/Output (GPIO) port of the LED flash driver IC 108, or an I²C interface. Such control may involve the exclusive operation of either the LED flash driver IC 108 or audio amplifier 124, or operating the LED flash driver IC 108 and the audio amplifier 124 simultaneously. When operating simultaneously, the control includes reducing the gain of the audio amplifier 124. Since the audio amplifier 124 is external to the controller in LED flash driver IC 108, the audio signal level is not monitored before the LED flash is turned on. Thus, the gain amount of the audio signal that needs to be attenuated is hard to determine, and in most cases, due to the high crest factor of music contents, a need to reduce audio gain may not even exist. Thus, the controller for the LED flash driver 108 is limited to being used to control the audio amplifier 124. Therefore, it is desirable to provide a way to control both the LED flash driver and the audio amplifier by using a controller that is on a single integrated circuit.

SUMMARY OF THE INVENTION

The above stated objective of using a single boost converter in a single integrated circuit that supplies power to two or more separate operational or functional circuits in the single integrated circuit is accomplished in a single integrated circuit and a method. The method is a method of driving a first circuit and a second circuit using a single boost converter that are all within the single integrated circuit.

The single integrated circuit includes a single boost converter, a first circuit, a second circuit, and a controller. The single boost converter supplies power. The first circuit provides a circuit operation and is coupled to the single boost converter that supplies power to the first circuit. The second circuit provides another circuit operation and is coupled to the single boost converter that supplies power to the second circuit. The controller is coupled to the single boost converter, the first circuit, and the second circuit. The controller receives an operational mode signal and in response to the operational mode signal, drives the single boost converter to respectively provide power to the first circuit and the second circuit.

The controller may be a single controller. When the first and second circuits are simultaneously active, the controller manages an operation of the first circuit so that proper operation of the second circuit is maintained. In one embodiment, the first circuit may be an LED flash driver, and the second circuit may be an audio amplifier, such as a Class-D audio amplifier. The controller manages an operation of the audio amplifier so that a sufficient amount of current is supplied to the LED flash driver for proper operation of the LED flash driver. One way of the controller managing the operation of the audio amplifier is by maintaining the power through the audio amplifier within a power amplitude limit. Another way of the controller managing the operation of the audio amplifier is by mapping power between the audio amplifier and the LED flash driver based on a total amount of power provided by the single boost converter. A further way of the controller managing the operation of the audio amplifier is by maintaining the power through the audio amplifier within a power amplitude limit. A still further way of the controller managing the operation of the audio amplifier is by lowering a volume signal of the audio amplifier to ensure that the sufficient amount of current is supplied to the LED flash driver for proper operation of the LED flash driver.

BRIEF DESCRIPTION OF THE DRAWINGS

FIG. 8 is an exemplary chart showing the mapping of power supplied to the LED flash driver and the audio amplifier.

DETAILED DESCRIPTION

Figure 1:
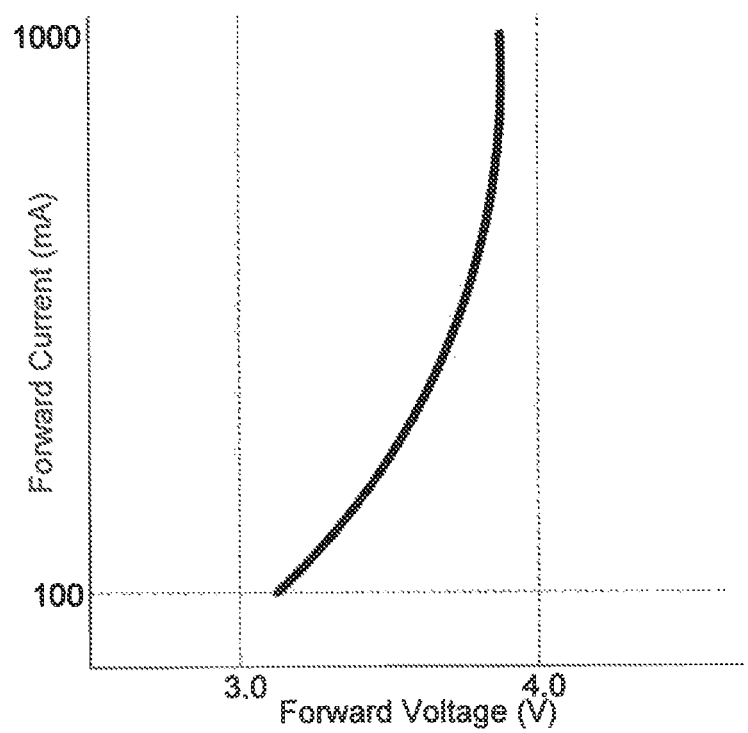
FIG. 1 is a plot diagram showing the forward current versus forward voltage relationship for an exemplary LED flash driver in accordance with the prior art.
Figure 2:
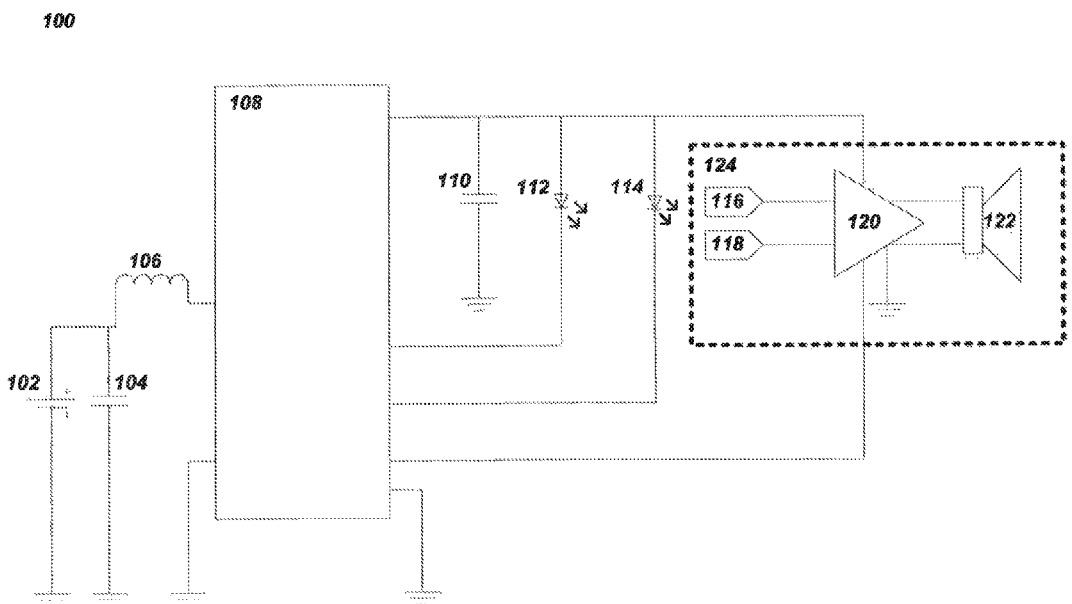
FIG. 2 is an exemplary block diagram of an LED flash driver and audio amplifier power supply in accordance with the prior art in which a single boost converter is used to simultaneously drive both the LED flash driver and audio amplifier power supply.
Figure 3:
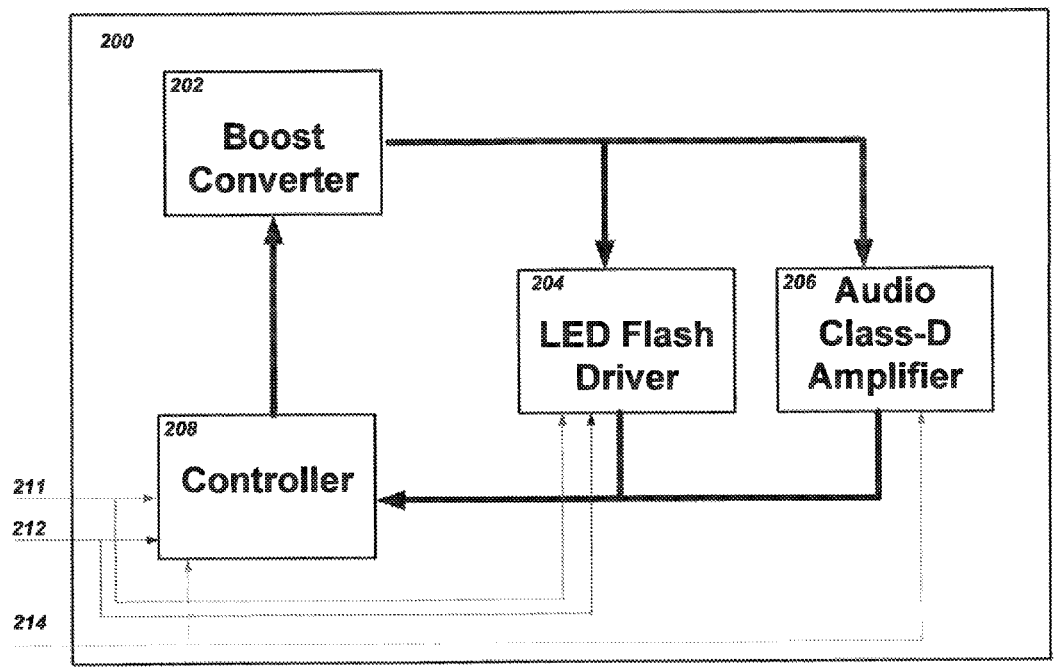
FIG. 3 is an exemplary block diagram of a single integrated circuit that uses a single boost converter in the single integrated circuit that supplies power to two or more separate operational or functional circuits, such as an LED flash driver and an audio amplifier, in the single integrated circuit.
Figure 4:
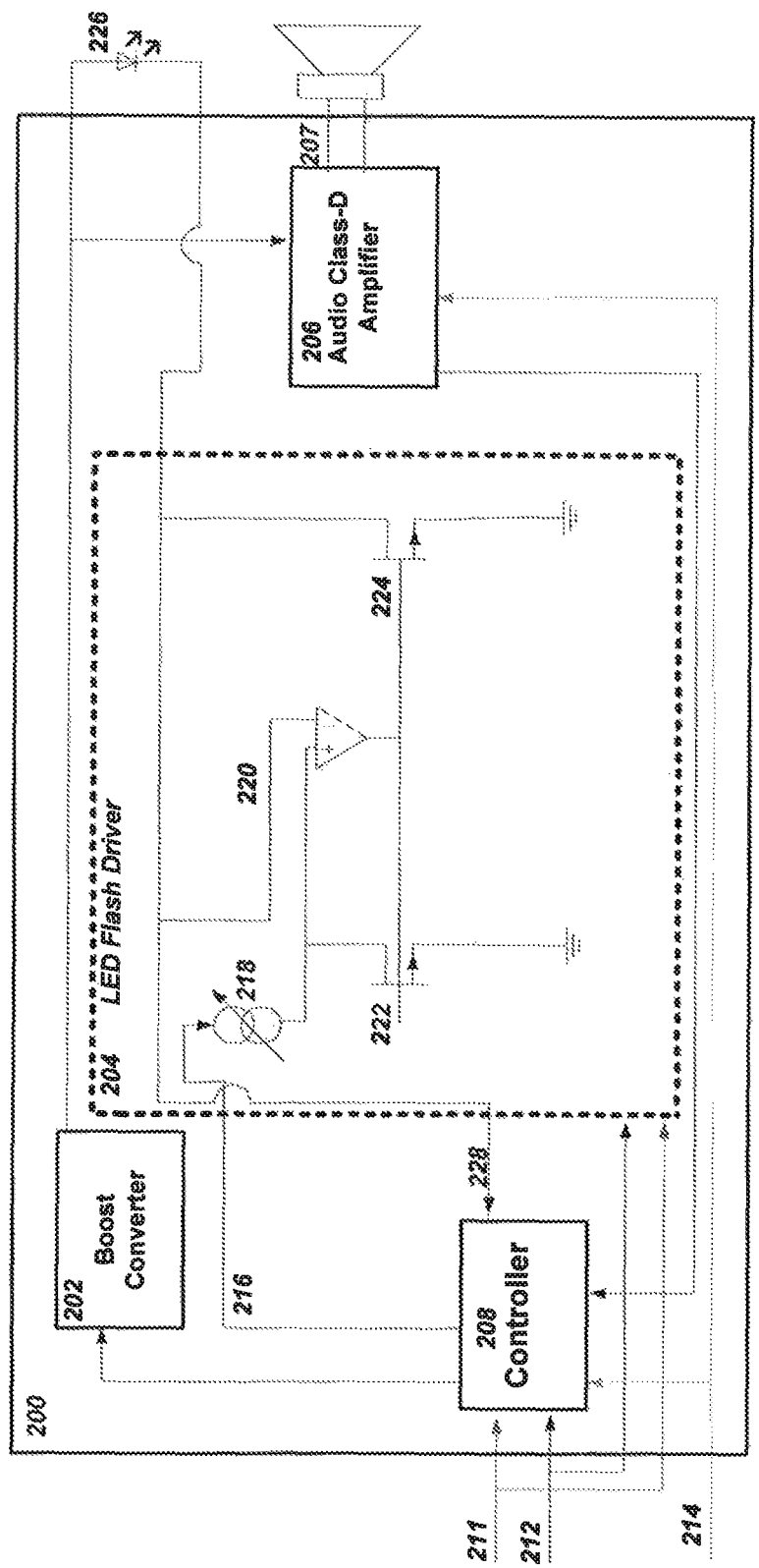
FIG. 4 is a more detailed exemplary block diagram of an LED flash driver to which the single boost converter in the single integrated circuit supplies power.

A single integrated circuit ("IC") 200 has a single boost converter 202 that is used to supply power to two or more separate operational or functional circuits in the IC 200. FIG. 3 shows an exemplary block diagram of the IC 200 with a boosted audio class D amplifier 206 and an integrated LED flash driver 204. The LED flash driver 204 can be a first circuit that provides LED flash driver circuit operations, and the audio amplifier 206 can be a second circuit that provides audio amplification circuit operations. The single IC 200 comprises a controller 208 that is coupled to a single boost converter 202, LED flash driver 204, and audio amplifier 206. The single boost converter 202 is able to drive both the LED flash driver 204 and audio amplifier 206, wherein the LED flash driver 204 requires a constant current in order to drive the LED flash and the audio amplifier 206 requires a constant voltage to operate. The controller 208 is coupled to all three blocks on the single integrated circuit 200 that enables both LED flash and audio capability. Controller 208 receives an external operational mode signal(s), such as is_flash_on signal 211 (i.e., LED flash on signal), is_movie_on signal 212 (i.e., Movie on signal), and is_audio_on signal 214 (i.e., Audio on signal). In FIG. 3, the LED flash driver 204 is supplied with boosted power from the boost converter 202 that is set by the controller 208 in order to maintain constant current for the LED flash driver 204 to operate its flash capability. FIG. 4 shows a more detailed exemplary block diagram of the LED flash driver 204. The LED flash driver 204 receives a control input signal 216 from the controller 208 and sends the control input signal 216 from the controller 208 to the current source 218. The current source 218 is able to adjust and set the current accordingly using the ratio systematic implementation of two field effect transistors ("FETs"). Once the current has been adjusted to drive the LED flash diode 226, a real time voltage at the output of the LED flash diode 226 is fed back to the controller 208 through feedback voltage signal 228. This real time feedback voltage signal 228 factors in and accounts for different forward voltage drops of the flash being used (e.g., the forward voltage drops of the LED flash diode 226). The controller 208 provides thermal management of the flash operation by adjusting the constant current provided to the LED flash driver 204 in accordance with different working conditions of the flash. This thermal management of flash operations ensures that the amount of power dissipated in the die is minimized or reduced.

As shown in FIG. 3, the audio Class D amplifier 206 is supplied with boosted power from the boost converter 202 that is set by the controller 208 in order to maintain constant voltage for the audio amplifier 206 to maintain operations.

Figure 5:
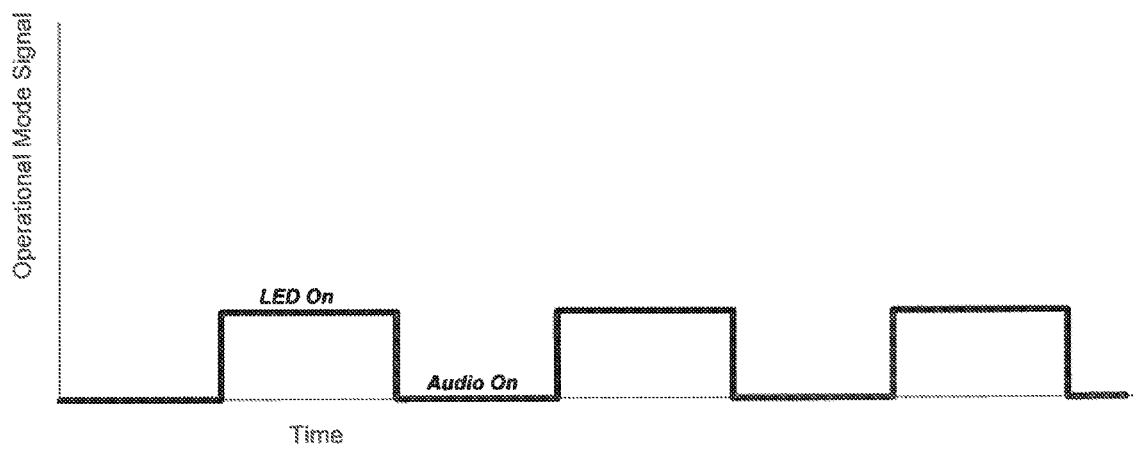
FIG. 5 is an exemplary timing diagram for a signal of the single integrated circuit that signifies whether the LED flash is on and being used or whether the audio amplifier is on and being used.

The IC 200 has two modes of operation: an LED flash mode and audio amplifier mode. The LED flash mode is when the flash capability is turned on, and the audio amplifier mode is when the audio capability is turned on. FIG. 5 shows an exemplary timing diagram of an is_flash_on signal 211. The high values of the is_flash_on signal 211 connote when LED flash is on and being used (e.g., in LED flash mode) while the low values of is_flash_on signal 211 connote when the audio amplifier 206 is on and being used (e.g., audio amplifier mode). This operational mode signal is, but is not limited to, a square wave signal.

In the LED flash mode, there are two LED flash driver modes of operation for driving constant current to the LED flash driver 204. The first LED flash driver mode is a camera mode in which the constant current applied to the LED flash driver 204 is a high current value. The second LED flash driver mode is a movie mode in which the constant current applied to the LED flash driver 204 is a low current value. When the LED flash driver 204 is on, an is_camera_on signal provides an indication to the controller 208 that the LED flash driver mode is in camera mode. When both the camera and movie mode are on, the camera mode overrides the movie mode and provides an indication to the controller 208 that the camera mode is on, or otherwise provides an indication to the controller 208 that the LED flash driver mode is in the movie mode.

IC 200 driving the LED flash driver 204 and the audio amplifier 206 is not limited in any particular ways for operating and/or configurations as various ways for operating and different configurations for IC 200 exist, including but not limited to the ones disclosed in this detailed description. The is_audio_on signal 214 is the signal that indicates to the controller 208 when the audio amplifier 206 is to be turned on irrespective of the mode of operation or the LED flash driver mode for IC 200.

A first exemplary IC operating configuration is when the audio class D amplifier 206 is on and the LED flash driver 204 is completely off (e.g., when the is_audio_on signal 214 is on and IC 200 is in audio amplifier mode) or when the audio class D amplifier 206 is completely off and the LED flash driver 204 is on (e.g., when the is_flash_on signal 211 is on and the IC 200 is in LED flash mode). For the first exemplary IC operating configuration, the is_flash_on signal 211 is the signal that indicates to controller 208 when the flash is turned on, and the is_audio_on signal 214 is the signal that indicates to controller 208 to turn on the audio amplifier 206. However, in one implementation, when is_flash_on signal 211 is on and the flash is turned on, the controller 208 ensures that audio amplifier 206 is off, despite whether is_audio_on signal 214 is on.

A second exemplary IC operation configuration is when both the audio class D amplifier 206 and the LED flash driver 204 are on. In this configuration, both the is_audio_on signal 214 and the is_flash_on signal 211 indicate to the controller 208 that LED flash driver 204 and audio amplifier 206 are on. The second exemplary IC operation configuration focuses on the LED flash driver 204 being on, but the LED flash driver 204 may be operating in a certain LED flash driver mode (e.g., movie mode or camera mode).

Figure 6:
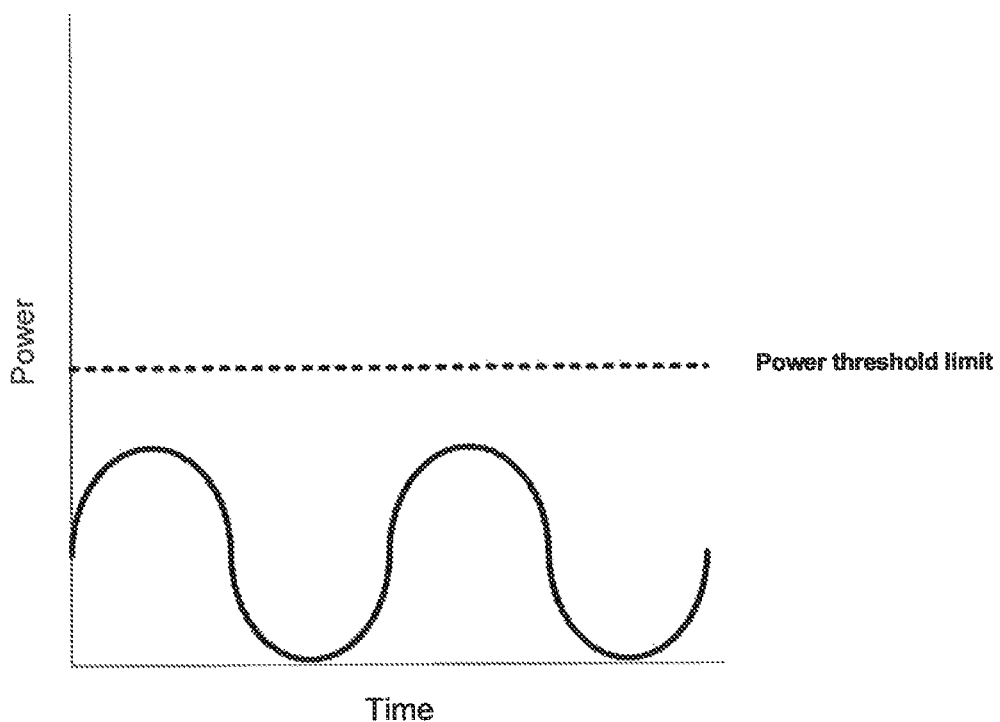
FIG. 6 is a plot diagram showing a power versus time relationship for the LED flash driver and the audio amplifier in which the single integrated circuit is operating in a mode such that operation of both the LED flash and the audio amplifier does not exceed a power threshold limit.
Figure 7:
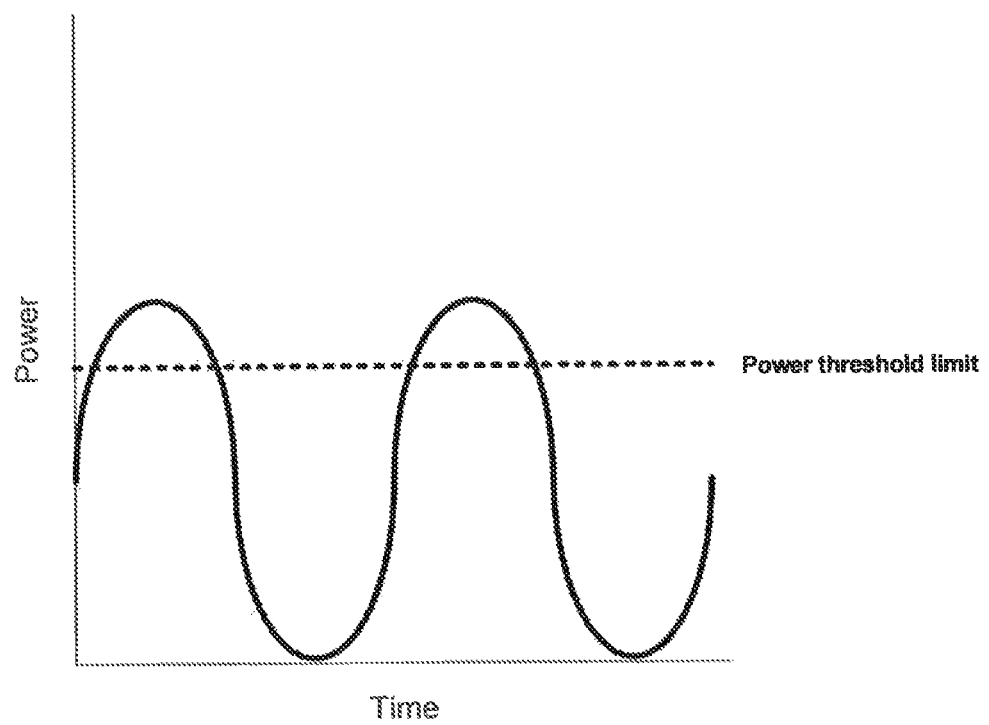
FIG. 7 is a plot diagram showing a power versus time relationship for the LED flash driver and the audio amplifier in which the single integrated circuit is operating in a mode such that operation of both the LED flash and the audio amplifier does exceed a power threshold limit.

However, a problem may arise in this second exemplary IC operation configuration in that depending upon the power being dissipated by the audio amplifier 206, the total power provided by the boost converter 202 to the LED flash driver 204 and audio class D amplifier 206 may not be enough to drive the LED flash driver 204 when the flash turns on. An example is shown in FIG. 6 wherein the IC 200 is operating in the movie mode (e.g., a low power mode), such as when recording a movie, and wherein the amount of power required to record the movie (e.g., when the audio amplifier 206 is on and when the flash is either off or being operated at a low power mode) can be below the power threshold limit and therefore no attenuation of the audio amplifier 206 (such as, for example, the attenuation of the power or output signal of the audio amplifier 206) is required. However, as contrastingly shown in FIG. 7, when the IC 200 is in a camera mode (e.g., when flash is on and when LED flash is operated at a high or higher power mode), for example when taking a still photograph, a greater amount of power is required to drive the flash when the flash turns on and the total power required to drive the flash and the audio amplifier 206 may be greater than the power threshold limit. Therefore, there are two ways of handling and solving the situation of not having sufficient power supplied to both the LED flash driver 204 and audio class D amplifier 206 when both are on.

One exemplary way of solving the insufficient power problem to both the LED flash driver 204 and the class D audio amplifier 206 is to map the power supplied to the LED flash driver 204 and audio amplifier 206. Mapping of the power by limiting the power to the audio amplifier 206 accordingly and only when necessary ensures that enough constant current is provided to the LED flash driver 204. FIG. 8 shows an exemplary power mapping chart that an algorithm which the controller 208 would incorporate to calculate and determine the amount of constant current required to be provided to the LED flash driver 204. The first column shows the mode of operation that the IC 200 operates (e.g., the IC 200 mode of operation), such as the LED flash mode or audio amplifier mode. The second column shows the LED flash driver mode when the flash is on, such as the camera mode or the movie mode. The third column shows the amount of power P_boost provided by the boost converter 202, and the fourth column shows the power required to drive the LED flash driver 204 (e.g., power P_Camera for camera mode, power P_Movie for movie mode, and 0 power for audio amplifier mode). The fifth right most column shows the equations used to calculate the amount of power provided to the audio amplifier 208, which is the difference between the power P_boost provided by the boost converter 202 and the power required by the LED flash driver 204. By mapping the power in this way between the two devices, boost converter 202 provides sufficient power and respective constant current for ensuring the driving of the LED flash driver 204, and uses the remaining power for driving the audio amplifier 206.

Figure 9:
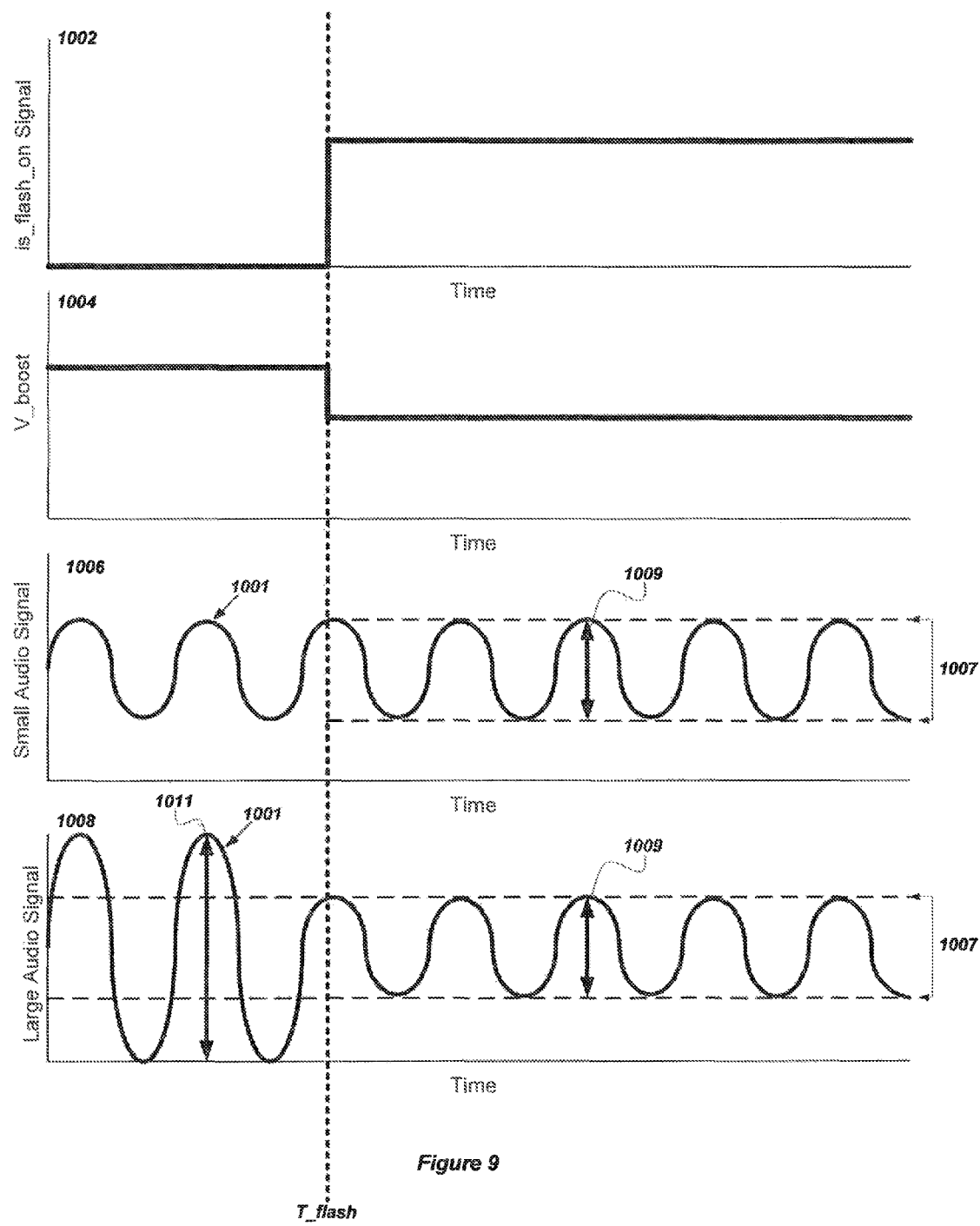
FIG. 9 is an exemplary timing diagram of various signals for the single integrated circuit when the LED flash is turned on at higher audio signals of the audio amplifier.

FIG. 9 shows an exemplary timing diagram of when the flash is turned on at higher audio signals. Exemplary timing diagram 1002 shows when the is_flash_on signal goes high at time T_flash. Exemplary timing diagram 1004 shows the boost voltage V_boost that is the output voltage of the boost converter 202 slightly decreasing at time T_flash. Timing diagram 1006 shows an exemplary audio output signal of audio amplifier 206. In timing diagram 1006, the audio output signal 1001 is shown as a small audio signal having a magnitude 1009 that stays within a power amplitude limit 1007. Thus, in this case, no attenuation of the audio output signal 1001 is required. However, in timing diagram 1008, the audio output signal 1001 is shown as a large audio signal having a magnitude 1011 before time T_flash that now extends beyond the power amplitude limit 1007. In this latter case, attenuation of the audio output signal 1001 is required so that the audio amplifier 206 operates at a lower power having a magnitude 1009 that is within the power amplitude limit 1007, as shown after time T_flash in FIG. 9.

Figure 10:
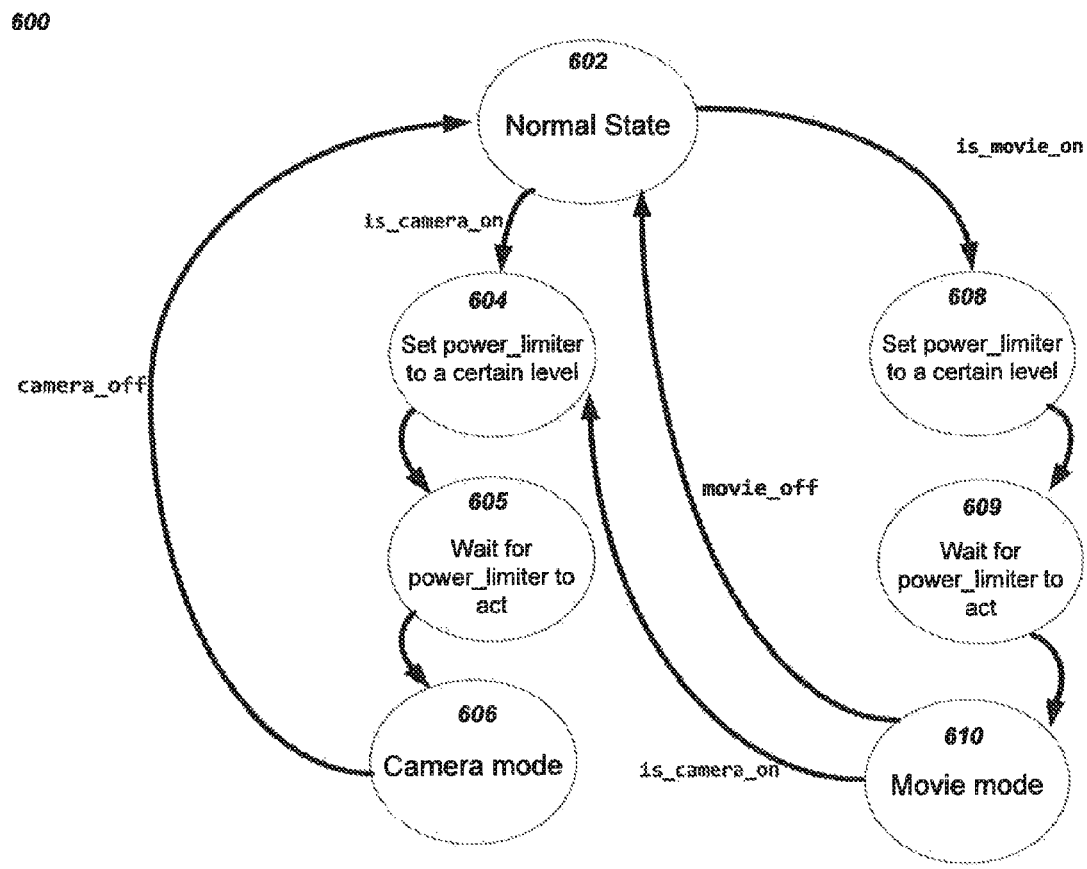
FIG. 10 is an exemplary state diagram of an algorithm for the controller shown in FIGS. 3 and 4.

A power limiting function power_limiter (see power_limiter in states 604 and 608 of state diagram 600 in FIG. 10) is programmed in the controller 208, and the power_limiter function is able to monitor overall total power through LED flash driver 204 and audio amplifier 206 and attenuate the magnitude of the power through the audio amplifier 206 if the magnitude is greater than the power amplitude limit, such as in accordance with the timing diagrams in FIG. 9. Therefore, the power_limiter function will attenuate the power to ensure the amount of power is within the power amplitude limit and map the power between the LED flash driver 204 and audio amplifier 206 accordingly.

FIG. 10 shows the state diagram 600 of an exemplary algorithm for controller 208. State diagram 600 starts at the normal state 602. At normal state 602, the audio amplifier 206 is on and the LED flash driver 204 is off. The controller 208 waits to receive an indication of whether the LED flash driver mode is to be in the camera mode or movie mode. If controller 208 receives an is_camera_on signal that IC 200 is to operate in the camera mode, then the controller algorithm moves from normal state 602 to state 604 where the power_limiter function sets the power amplitude limit 1007 at a certain level to operate IC 200 in camera mode. Controller algorithm then moves from state 604 to state 605 where the IC 200 waits for the power_limiter function to act and adjust and output the power accordingly. Then the controller algorithm moves from state 605 to state 606 where IC 200 operates in the camera mode until the controller algorithm receives a camera_off signal indicating that IC 200 is no longer operating in the camera mode and returns back to normal state 602. At normal state 602, if controller 208 receives an is_movie_on signal 212 that indicates movie mode is to be turned on, the controller algorithm moves from normal state 602 to state 608. At state 608, the power_limiter function sets the power amplitude limit 1007 at a certain level to operate IC 200 in movie mode. From state 608, the algorithm moves to state 609 where the IC 200 waits for the power_limiter to act and adjust and output the power respectively. Then the controller algorithm moves from state 609 to state 610 where IC 200 operates in the movie mode. From state 610, if the controller algorithm receives a movie_off signal, then IC 200 is no longer operating in the movie mode and returns back to normal state 602. Alternatively, at state 610, if the controller algorithm receives an is_camera_on signal, then IC 200 moves from operating from the movie mode to the camera mode and controller algorithm moves from state 610 to state 604 and continues to operate therefrom.

Another exemplary method for solving the problem of when both the LED flash driver 204 and the class D audio amplifier 206 are on is to enable an audio volume control and allow the lowering of the volume output of audio amplifier 206 when necessary. In the case just where the class D audio amplifier 206 is on, the volume output signal may be set at an exemplary volume level of 18 dB. In the case of when both the LED driver 204 and audio amplifier 206 are on, the volume output signal of audio amplifier 206 is lowered in order to provide sufficient constant current to run through the LED flash driver 204. Depending on whether the LED flash driver mode of operation is in camera or movie mode, the controller 208 lowers the volume accordingly. For example, in the movie mode, controller 208 decreases the volume output signal level to 15 dB, and in the camera mode, controller 208 decreases the volume output signal level to 12 dB. The lowering of the volume level accordingly allows for sufficient power to be supplied to the LED flash driver 204 and the audio amplifier 206.

There are many benefits of the single integrated circuit for an audio subsystem with a boosted Class-D amplifier and integrated LED flash driver. Using a single boost converter to supply power to both the Class-D amplifier and the LED flash driver within a single integrated circuit allows for greater deliverance of power to the class D amplifier without any extra cost. Also with such integration into a single integrated circuit, there is an increase of efficiency because of the ability to limit and balance power of the total system. In addition, it allows for more flexible control to maximize the audio quality without sacrificing the chip area to handle the thermal stress from the LED driver.

Although embodiments have been described in detail, it should be understood that various changes, substitutions, and alterations can be made hereto without departing from the spirit and scope of the invention as defined by the appended claims.

What is claimed is:

1. A single integrated circuit, comprising:
a single boost converter that supplies power;
an LED flash driver coupled to the single boost converter that supplies power to the LED flash driver;
an audio amplifier coupled to the single boost converter that supplies power to the audio amplifier; and
a controller coupled to the single boost converter, the LED flash driver, and the audio amplifier wherein the controller receives an operational mode signal, monitors a power limit of the single boost converter, and monitors an overall total power through the LED flash driver and the audio amplifier, and in response to the operational mode signal, the monitored power limit, and the monitored overall total power, drives the single boost converter to respectively provide a portion of a boost power of the single boost converter within the monitored power limit to the LED flash driver and another portion of the boost power of the single boost converter within the monitored power limit to the audio amplifier so that the LED flash driver and the audio amplifier can simultaneously operate.

2. The single integrated circuit of claim 1, wherein the controller is a single controller.

3. The single integrated circuit of claim 1, wherein the audio amplifier is a Class-D audio amplifier.

4. The single integrated circuit of claim 1, wherein the operational mode signal comprises an LED flash on signal that indicates to the controller to operate in an LED flash mode.

5. The single integrated circuit of claim 4, wherein the LED flash on signal is a square wave signal in which a high value of the square wave signal indicates to the controller to operate in the LED flash mode.

6. The single integrated circuit of claim 1, wherein the operational mode signal comprises an audio amplifier on signal that indicates to the controller to turn on the audio amplifier.

7. The single integrated circuit of claim 6, wherein the audio amplifier on signal is a square wave signal in which a high value of the square wave signal indicates to the controller to turn on the audio amplifier.

8. The single integrated circuit of claim 7, wherein the operational mode signal further comprises an LED flash on signal and a high value of the square wave signal indicates to the controller to operate in the LED flash mode.

9. The single integrated circuit of claim 1, wherein the LED flash driver and the audio amplifier are simultaneously active.

10. The single integrated circuit of claim 9, wherein the controller manages an operation of the audio amplifier so that a sufficient amount of current is supplied to the LED flash driver for proper operation of the LED flash driver.

11. The single integrated circuit of claim 10, wherein the controller manages the operation of the audio amplifier by mapping power between the audio amplifier and the LED flash driver when the monitored overall total power exceeds the monitored power limit.

12. The single integrated circuit of claim 11, wherein the controller manages the operation of the audio amplifier by maintaining the power through the audio amplifier at a certain power setting.

13. The single integrated circuit of claim 12, wherein the LED flash driver operates in a LED flash driver mode.

14. The single integrated circuit of claim 13, wherein the LED flash driver mode is a camera mode or a movie mode.

15. The single integrated circuit of claim 14, wherein in the camera mode, the power amplitude-limit is set at a certain level, and in the movie mode, the power amplitude is set at another certain level.

16. The single integrated circuit of claim 10, wherein the controller manages an operation of the audio amplifier by lowering a volume signal of the audio amplifier to ensure that the sufficient amount of current is supplied to the LED flash driver for proper operation of the LED flash driver.

17. The single integrated circuit of claim 1, wherein a feedback voltage indicator of the LED flash driver is fed back to the controller indicating if the LED flash driver has reached a power amplitude setting.

18. The single integrated circuit of claim 9, wherein the controller manages an operation of the LED flash driver by lowering a power setting of the LED flash driver so that proper operation of the audio amplifier is maintained.

19. A method of driving an LED flash driver and an audio amplifier using a single boost converter that are all within a single integrated circuit, comprising:
   supplying, by the single boost converter, power to the LED flash driver;
   supplying, by the single boost converter, power to the audio amplifier; and
   controlling, by a controller, the single boost converter, the LED driver, and the audio amplifier;
   receiving, by the controller, an operational mode signal;
   monitoring, by the controller, a power limit of the single boost converter;
   monitoring, by the controller, an overall total power through the LED flash driver and the audio amplifier; and
   in response to the operational mode signal, the monitored power limit, and the monitored overall total power, driving, by the controller, the single boost converter to respectively provide a portion of a boost power of the single boost converter within the monitored power limit to the LED flash driver and another portion of the boost power of the single boost converter within the monitored power limit to the audio amplifier so that the LED flash driver and the audio amplifier can simultaneously operate.

20. The method of claim 19, wherein the controller is a single controller.

21. The method of claim 19, wherein the audio amplifier is a Class-D audio amplifier.

22. The method of claim 19, further comprising:
   simultaneously activating the LED flash driver and the audio amplifier.

23. The method of claim 22, further comprising:
   managing, by the controller, an operation of the audio amplifier so that a sufficient amount of current is supplied to the LED flash driver for proper operation of the LED flash driver.

24. The method of claim 23, wherein the managing step further comprises:
   managing, by the controller, the operation of the audio amplifier by mapping power between the audio amplifier and the LED flash driver when the monitored overall total power exceeds the monitored power limit.

25. The method of claim 23, wherein the managing step further comprises:
   managing, by the controller, the operation of the audio amplifier by maintaining the power through the audio amplifier within a power amplitude.

26. The method of claim 23, wherein the managing step further comprises:
   managing, by the controller, an operation of the audio amplifier by lowering a volume signal of the audio amplifier to ensure that the sufficient amount of current is supplied to the LED flash driver for proper operation of the LED flash driver.

* * * * *